United States Patent
Nagasaka et al.

(10) Patent No.: US 10,286,753 B2
(45) Date of Patent: May 14, 2019

(54) ON-STATE MALFUNCTION DETECTION DEVICE AND METHOD THEREFOR

(71) Applicant: MITSUBISHI HEAVY INDUSTRIES THERMAL SYSTEMS, LTD., Minato-ku, Tokyo (JP)

(72) Inventors: Keiji Nagasaka, Tokyo (JP); Hidetaka Sato, Aichi (JP); Tomoyasu Osaki, Aichi (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 196 days.

(21) Appl. No.: 15/113,143

(22) PCT Filed: Feb. 2, 2015

(86) PCT No.: PCT/JP2015/052842
§ 371 (c)(1),
(2) Date: Jul. 21, 2016

(87) PCT Pub. No.: WO2015/137006
PCT Pub. Date: Sep. 17, 2015

(65) Prior Publication Data
US 2017/0021696 A1   Jan. 26, 2017

(30) Foreign Application Priority Data

Mar. 11, 2014   (JP) ................................ 2014-047758

(51) Int. Cl.
*B60L 1/02*      (2006.01)
*H05B 1/02*      (2006.01)
(Continued)

(52) U.S. Cl.
CPC ....... *B60H 1/00978* (2013.01); *B60H 1/2218* (2013.01); *G01R 31/006* (2013.01);
(Continued)

(58) Field of Classification Search
CPC .... B60H 1/00978; B60H 1/22; B60H 1/2218; B60H 2001/2231; B60H 2001/2256;
(Continued)

(56) References Cited

U.S. PATENT DOCUMENTS 7,463,079 B2 *  12/2008  De ................... H03K 17/08128
                                                    327/309
2002/0011477 A1 *  1/2002  Jones ..................... H05B 3/146
                                                    219/219

(Continued)

FOREIGN PATENT DOCUMENTS

CN    1988385 A    6/2007
JP    4-158272 A   6/1992
(Continued)

OTHER PUBLICATIONS

English translation of JP4-158272, 1992.*
(Continued)

*Primary Examiner* — Sang Y Paik
(74) *Attorney, Agent, or Firm* — Birch, Stewart, Kolasch & Birch, LLP.

(57) ABSTRACT

The on-state malfunction detection device detects an on-state malfunction, for instance, in an IGBT that is provided to correspond to a PTC element whose electrical resistance value varies according to temperature and that controls the electrification of the PTC element. In a state in which a turn-off instruction has been outputted from a control device to the IGBT, the on-state malfunction detection device determines through calculation an electric potential difference following voltage division of the voltage between the both ends of the PTC element, and detects an on-state malfunction of the IGBT when this electric potential difference is equal to or greater than a predetermined threshold value. This allows for the detection of an on-state malfunction in a switching element that performs an electrical conduction control for an element whose electrical resistance value varies according to temperature.

8 Claims, 6 Drawing Sheets

(51) Int. Cl.
  *B60H 1/00*   (2006.01)
  *B60H 1/22*   (2006.01)
  *G01R 31/00*  (2006.01)
  *G01R 31/27*  (2006.01)

(52) U.S. Cl.
  CPC ............ *G01R 31/27* (2013.01); *H05B 1/0227* (2013.01); *H05B 1/0236* (2013.01); *B60H 2001/2231* (2013.01); *B60H 2001/2256* (2013.01)

(58) Field of Classification Search
  CPC .... G01R 31/006; G01R 31/27; H05B 1/0227; H05B 1/0236
  USPC ..... 219/202, 481–487, 504, 505; 361/54–57, 361/93.1, 93.7, 93.9
  See application file for complete search history.

(56) References Cited

U.S. PATENT DOCUMENTS

2003/0217559 A1* 11/2003 Ieda .................. B60H 1/00428
                                                    62/230

2007/0139841 A1   6/2007  Ohshima

FOREIGN PATENT DOCUMENTS

| | | |
|---|---|---|
| JP | 2004-266097 A | 9/2004 |
| JP | 2008-34141 A | 2/2008 |
| JP | 2008-220058 A | 9/2008 |
| JP | 2008-277351 A | 11/2008 |
| JP | 2009-290978 A | 12/2009 |
| JP | 4570659 B2 | 10/2010 |
| JP | 2011-113809 A | 6/2011 |
| JP | 2012-75262 A | 4/2012 |
| JP | 5235847 B2 | 7/2013 |
| JP | 2013-159135 A | 8/2013 |
| JP | 5434388 B2 | 3/2014 |

OTHER PUBLICATIONS

English translstion of JP2008-34141, 2008.*
Office Action dated Aug. 28, 2018 in corresponding Chinese Application No. 201580005778.4 with an English Translation.

* cited by examiner

ON-STATE MALFUNCTION DETECTION DEVICE AND METHOD THEREFOR

TECHNICAL FIELD

The present invention relates to an on-state malfunction detection device that detects an on-state malfunction in, for example, a switching element that performs electrical conduction control of an element whose electrical resistance varies according to a temperature of a PTC element or the like, and relates to a method therefor.

BACKGROUND ART

In vehicle AC devices employed in electric automobiles, hybrid vehicles, and the like, for example, a PTC heater that uses a positive temperature coefficient thermistor element (called a "PTC element" hereinafter) as a heat generating element is known as an example of a heat source for heating (see Patent Documents 1 and 2, for example).

Electrification control of a PTC element is carried out by turning a switching element such as an insulated gate bipolar transistor (IGBT) on and off, and in the case where the switching element has malfunctioned, a current will continue to flow to the PTC heater. It is therefore necessary to detect an on-state malfunction in the switching element.

CITATION LIST

Patent Documents

Patent Document 1: Japanese Unexamined Patent Application Publication No. 2008-277351A
Patent Document 2: Japanese Unexamined Patent Application Publication No. 2013-159135A

SUMMARY OF INVENTION

Technical Problem

Generally, a current sensor (a shunt resistor, a current transformer (CT), or the like) for detecting a current flowing in the PTC heater is provided in an electrification control circuit of the PTC heater. However, as illustrated in FIG. 7, a PTC element has characteristics such that an electrical resistance value thereof varies greatly in accordance with temperature, and thus there is a problem that the current flowing drops in the case where the temperature is high, the current flowing is obscured by error in the current sensor, an offset adjustment margin, and the like, and the current flowing cannot be detected. Although increasing the electrical resistance value of the shunt resistor enables detection, doing so generates heat, which means there is a limit on the electrical resistance value of the shunt resistor.

In addition, the current flowing in a switching element during an on-state malfunction is equal to the current normally flowing; as such, a current flowing during an on-state malfunction and a current flowing normally cannot be separated, and thus protection cannot be achieved by using a fuse.

The above-described problems are not limited to PTC elements, and are common among elements whose electrical resistance values vary according to temperature.

Having been achieved in light of such circumstances, an object of the present invention is to provide an on-state malfunction detection device capable of detecting an on-state malfunction in a switching element that carries out electrical conduction control of an element whose electrical resistance value varies according to temperature, and a method therefor.

Solution to Problem

A first aspect of the present invention is an on-state malfunction detection device configured to detect an on-state malfunction in a first switching element that is provided corresponding to an element whose electrical resistance value varies according to temperature and that controls electrification of the element, the device including a detection unit that, in a state in which a turn-off instruction has been outputted to the first switching element and power can be supplied to the element, detects an on-state malfunction in the first switching element in the case where a parameter regarding a voltage between both ends of the element is greater than or equal to a predetermined threshold value.

According to this aspect, in the case where a turn-off instruction has been outputted to the first switching element and power can be supplied to the element, the voltage between both ends of the element will be zero in the case where there is no on-state malfunction in the first switching element. On the other hand, in the case where there is an on-state malfunction in the first switching element, the on state is maintained even in the case where a turn-off instruction has been outputted, and thus the voltage between both ends of the element can be detected. Accordingly, an on-state malfunction can be detected on the basis of a parameter regarding the voltage between both ends of the element.

Although the element has characteristics in which an electrical resistance value thereof varies according to temperature, the voltage between both ends of the element has a constant value regardless of the temperature (the same or almost the same value as an applied voltage). Accordingly, by using a parameter regarding the voltage between both ends of the element, whether or not a current is flowing in the element can be detected easily even in the case where the current flowing in the element is small and cannot be detected with a conventional shunt resistor.

The above-described on-state malfunction detection device may further include a second switching element provided in a power source line that supplies power to the element, and the second switching element may be turned off in the case where an on-state malfunction has been detected by the detection unit.

According to the above-described configuration, the supply of power to the element can be cut off in the case where an on-state malfunction has been detected in the first switching element.

In the above-described on-state malfunction detection device, in the case where an on-state malfunction in the first switching element has not been detected, the detection unit may cause a turn-off instruction to be outputted to the second switching element and cause a turn-on instruction to be outputted to the first switching element, and in this state, may detect an on-state malfunction in the second switching element in the case where a parameter regarding a voltage between both ends of the element is greater than or equal to a predetermined threshold value.

In the case where the second switching element is provided, detecting an on-state malfunction not only in the first switching element but also in the second switching element makes it possible to improve safety.

In the above-described on-state malfunction detection device, the detection unit may include a first voltage dividing unit connected to a high-voltage side of the element, a second voltage dividing unit connected to a low-voltage side of the element, and a photocoupler connected in a forward direction in a line connecting an output terminal of the first voltage dividing unit and an output terminal of the second voltage dividing unit; and an on-state malfunction may be detected on the basis of an output of the photocoupler.

According to the above-described configuration, the detection unit can be configured simply and cheaply.

A second aspect of the present invention is a PTC heater including the above-described on-state malfunction detection device.

A third aspect of the present invention is a vehicle including auxiliary equipment including the above-described PTC heater, an electrical storage device used as a power source for the auxiliary equipment, a third switching element provided in a power line connecting the electrical storage device and the auxiliary equipment, and a vehicle control device. Here, the vehicle control device determines, in the case where an abnormality is detected in the vehicle and the third switching element has been opened, whether or not the abnormality is an overcurrent abnormality in the electrical storage device, with the third switching element remaining open; determines, in the case where the abnormality is determined not to be an overcurrent abnormality, whether or not the abnormality is an overcurrent abnormality in the auxiliary equipment, with the third switching element being closed; and detects a malfunction in the various devices that constitute the auxiliary equipment in the case where it has been determined that the abnormality is not an overcurrent abnormality in the auxiliary equipment.

In the above-described vehicle, when detecting a malfunction in the auxiliary equipment, a voltage lower than a voltage supplied during normal operation may be supplied from the electrical storage device.

Applying a lower voltage when detecting a malfunction than that applied during normal operation in this manner makes it possible to reduce the risk of the element being damaged, electrocutions, and the like.

In the above-described vehicle, a malfunction determination threshold value for the devices used when detecting a malfunction in the auxiliary equipment may be set to a value lower than a determination threshold value used by the vehicle control device to determine an overcurrent abnormality in the auxiliary equipment.

Through this, the determination of malfunctions in the devices can be finished before an overcurrent abnormality in the auxiliary equipment is detected by the vehicle control device. As a result, power can continue being supplied to devices operating normally.

In the above-described vehicle, the on-state malfunction detection device may be provided in the vehicle control device. This makes it possible to simplify the device.

A fourth aspect of the present invention is an on-state malfunction detection method for detecting an on-state malfunction in a first switching element that is provided corresponding to an element whose resistance value varies according to temperature and that controls electrification of the element, the method including detecting, in a state in which a turn-off instruction has been outputted to the first switching element and power can be supplied to the element, an on-state malfunction in the first switching element in the case where a parameter regarding a voltage between both ends of the element is greater than or equal to a predetermined threshold value.

Advantageous Effects of Invention

According to the present invention, an effect is achieved in which an on-state malfunction can be detected in a switching element that performs an electrical conduction control for an element whose electrical resistance value varies according to temperature.

DESCRIPTION OF EMBODIMENTS

[First Embodiment]

Hereinafter, an embodiment in which an on-state malfunction detection device and a method therefor according to the present invention is applied in a PTC heater will be described with reference to the drawings. Although the following will describe a PTC element as an example of an element whose electrical resistance value varies according to temperature, the present invention is not limited to this example.

Figure 1:
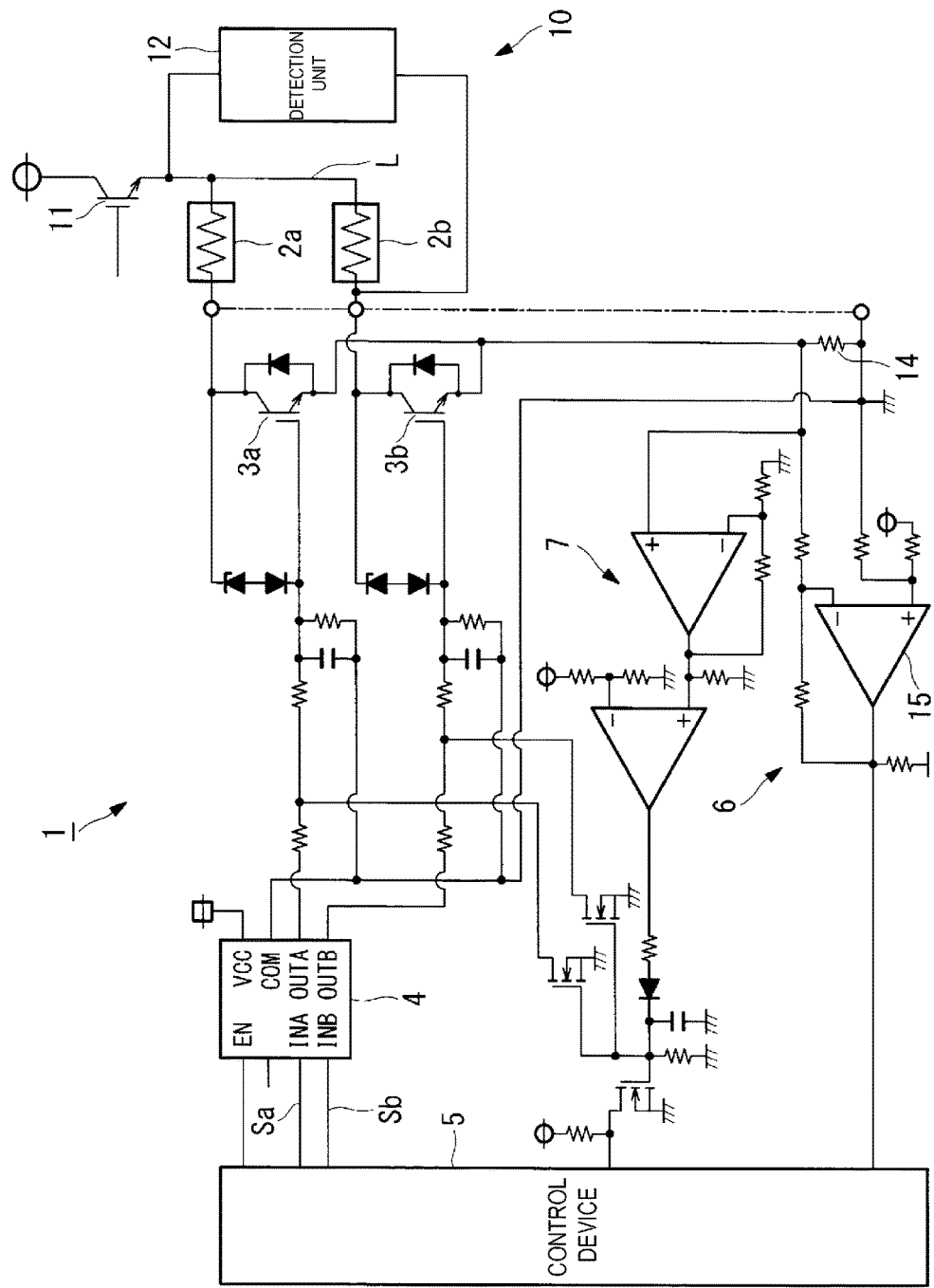
FIG. 1 is a schematic configuration diagram of a PTC heater according to a first embodiment of the present invention.

FIG. 1 is a schematic configuration diagram of a PTC heater according to a first embodiment of the present invention. As illustrated in FIG. 1, a PTC heater 1 is primarily configured including: PTC elements 2a and 2b whose electrical resistance values vary according to temperature; an insulated gate bipolar transistor (IGBT) (a first switching element) 3a that carries out electrification control of the PTC element 2a; an IGBT (first switching element) 3b that carries out electrification control of the PTC element 2b; a control device 5 that generates control signals Sa and Sb for controlling the IGBTs 3a and 3b and supplies the control signals Sa and Sb to a drive circuit 4; the drive circuit 4 that drives the IGBTs 3a and 3b on the basis of the control signals Sa and Sb; a current measurement unit 6 that detects a current flowing in the PTC elements 2a and 2b; an element short-circuit detection unit 7 that detects short-circuits of the PTC elements 2a and 2b; and an on-state malfunction detection device 10 that detects an on-state malfunction in the IGBT 3b.

Although FIG. 1 illustrates a case where two PTC elements are provided as an example, the number of PTC elements provided is not limited. Although the following will describe a case where an on-state malfunction in the IGBT 3b is detected as an example for the sake of convenience, an on-state malfunction in the IGBT 3a can be detected using the same method.

The drive circuit 4 drives the IGBTs 3a and 3b by applying voltage signals based on the control signals Sa and Sb to gates (electrical conduction control terminals) of the IGBTs 3a and 3b, respectively. Another power device such as a field-effect transistor (FET) or a metal-oxide-semiconductor FET (MOSFET) can also be used in place of the IGBTs.

The control device 5 is a microcomputer, for example, and implements various types of functions (on-off control of the PTC element, a short-circuit protection function, and the like) by a CPU reading out programs recorded in an auxiliary storage device to store the programs into a main storage device and executing those programs. For example, a known technique can be employed in normal on-off control of the PTC elements 2a and 2b.

The current measurement unit 6 includes a shunt resistor 14 and an op-amp 15 that amplifies and outputs a voltage between both ends of the shunt resistor 14. The output of the op-amp 15 is inputted to the control device 5.

The element short-circuit detection unit 7 detects a current flowing in the PTC elements 2a and 2b using the shunt resistor 14, detects a short-circuit in the PTC elements 2a and 2b in the case where a detected voltage is greater than or equal to a predetermined voltage, and outputs a short-circuit detection signal to the control device 5. Upon the short-circuit detection signal being inputted from the element short-circuit detection unit 7, the control device 5 outputs a load interrupt signal to the drive circuit 4 for putting the PTC elements 2a and 2b in an off state.

To eliminate response delay of the control device 5 in the case where a short-circuit has been detected, the element short-circuit detection unit 7 is configured to turn gate voltages of the IGBTs 3a and 3b off through hardware. In this manner, a higher current than normal will flow in the case of a short-circuit in the PTC element itself, which makes it possible to detect the short-circuit using the shunt resistor 14.

The on-state malfunction detection device 10 includes a power supply IGBT (second switching element) 11 provided in a power source line L that supplies power to the PTC elements 2a and 2b, and a detection unit 12. Turning the IGBT 11 on and off may, for example, be controlled by a microcomputer provided in the detection unit 12, which will be described later, or may be controlled on the basis of turn-on/turn-off instructions supplied by a control device (a higher-order control device) of a device in which the PTC heater 1 is provided.

Figure 2:
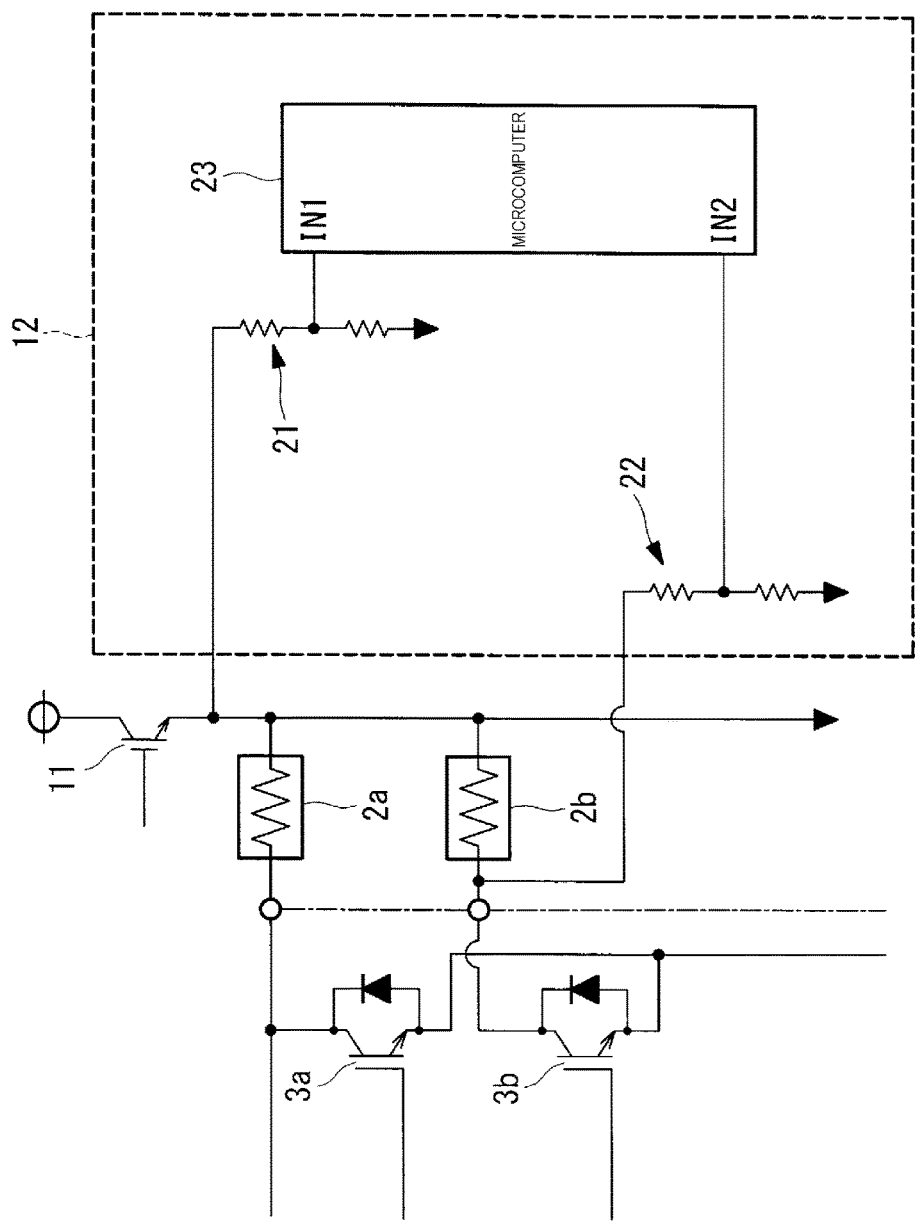
FIG. 2 is a diagram illustrating the overall configuration of an on-state malfunction detection device according to the first embodiment of the present invention.

The detection unit 12 detects an on-state malfunction in the IGBT 3b on the basis of a parameter regarding the voltage between both ends of the PTC element 2b. For example, as illustrated in FIG. 2, the detection unit 12 includes a high voltage-side voltage divider 21 connected to a high voltage side of the PTC element 2b, a low voltage-side voltage divider 22 connected to a low voltage side of the PTC element 2b, and a microcomputer 23 to which an output from the high voltage-side voltage divider 21 and an output from the low voltage-side voltage divider 22 are inputted.

The microcomputer 23 uses input information to compute a parameter, which is in this example a voltage between both ends following the voltage division, on the basis of the voltage between both ends of the PTC element 2b, and detects an on-state malfunction in the IGBT 3b in the case where the voltage is greater than or equal to a predetermined threshold value.

For example, in the case where the IGBT 3b is on, a current flows in the PTC element 2b, and a voltage drop determined by the current and the electrical resistance value of the PTC element 2b occurs. This voltage drop has the same value as the power source voltage. In this manner, the voltage between both ends of the PTC element 2b is constant regardless of the electrical resistance value of the PTC element 2b, and thus it is easy to detect an electrically conductive state in the PTC element 2b, or in other words, to detect that the IGBT 3b is on, even in the case where the electrical resistance value of the PTC element 2b is high and the current is low.

Here, in the case where the IGBT 3b is in an electrically conductive state, the voltage computed by the microcomputer 23 (the voltage between both ends following the voltage division) is determined by the power source voltage, a division ratio of the high voltage-side voltage divider 21, and a division ratio of the low voltage-side voltage divider 22, and does not exceed that value. The voltage between both ends of the PTC element 2b is zero when the IGBT 3b is in an off state. Accordingly, the predetermined threshold value in the microcomputer 23 may be set to a value greater than zero and less than or equal to the voltage value computed by the microcomputer 23 in the case where the IGBT 3b is in an electrically conductive state.

In the PTC heater 1 having the above-described configuration, detecting an on-state malfunction in the IGBT 3b and detecting an on-state malfunction in the IGBT 11 are carried out through the sequence described hereinafter.

First, the IGBT 3b is turned on, and gate voltages applied to the IGBTs 3a and 3b are set to off voltages (0 V, for example). In other words, the drive circuit 4 applies an off voltage to the gates of the IGBTs 3a and 3b. In this state, the output of the high voltage-side voltage divider 21 and the output of the low voltage-side voltage divider 22 are inputted to the microcomputer 23, and an electric potential difference (the voltage between both ends following the division) is computed by the microcomputer 23. When the voltage between both ends following the division is greater than or equal to the predetermined threshold value, an on-state malfunction in the IGBT 3b is determined, whereas when the stated voltage is less than the predetermined value, the IGBT 3b is determined to be normal.

In the case where an on-state malfunction has been detected, the supply of power to the PTC elements 2a and 2b is cut off by, for example, the microcomputer 23 turning the IGBT 11 off.

In the case where the IGBT 3b is normal, it is determined whether there is an on-state malfunction in the IGBT 11. In this case, an on-state malfunction in the IGBT 11 is determined in the case where the voltage between both ends following the division as computed by the microcomputer 23 is greater than or equal to the predetermined threshold value upon the IGBT 11 being turned off and the IGBT 3b being turned on.

In this case, an on-state malfunction detection signal is outputted to the control device 5 of the IGBTs 3a and 3b, and the IGBTs 3a and 3b are turned off. In the case where power is being supplied to the PTC heater 1 from a higher-order power source, the supply of power to the PTC heater 1 may be cut off by turning off a switch (not illustrated) provided in a power line between the higher-order power source and the PTC heater 1.

Figure 7:
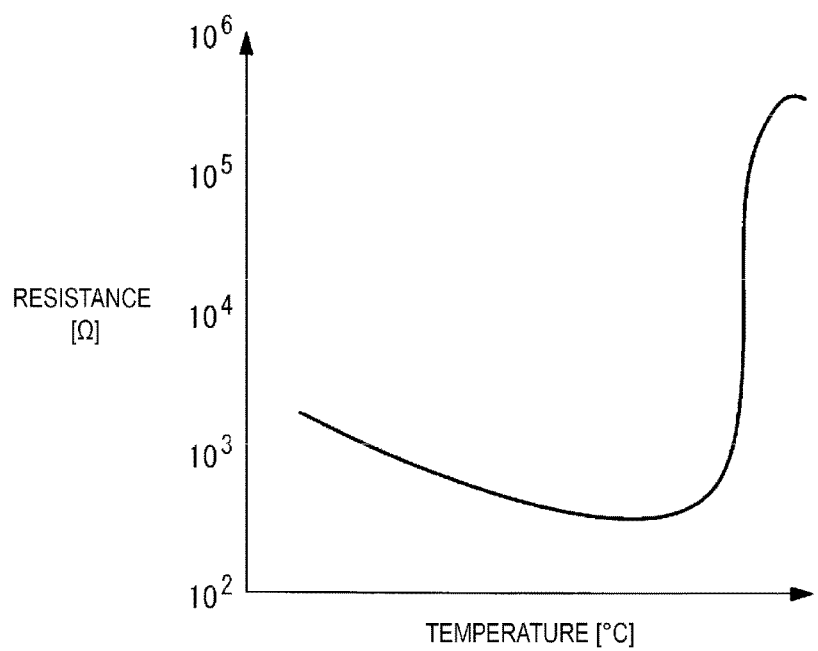
FIG. 7 is a diagram illustrating an example of temperature-electrical resistance characteristics of a PTC element.

As described thus far, according to the PTC heater 1 and the on-state malfunction detection device 10 of the present embodiment, an on-state malfunction is determined on the basis of a parameter based on the voltage between both ends of the PTC element 2b (that is, the voltage between both ends following the division), and thus the on-state malfunction can be determined regardless of the temperature-electrical resistance characteristics of the PTC element 2b (see FIG. 7, for example).

[Second Embodiment]

Figure 3:
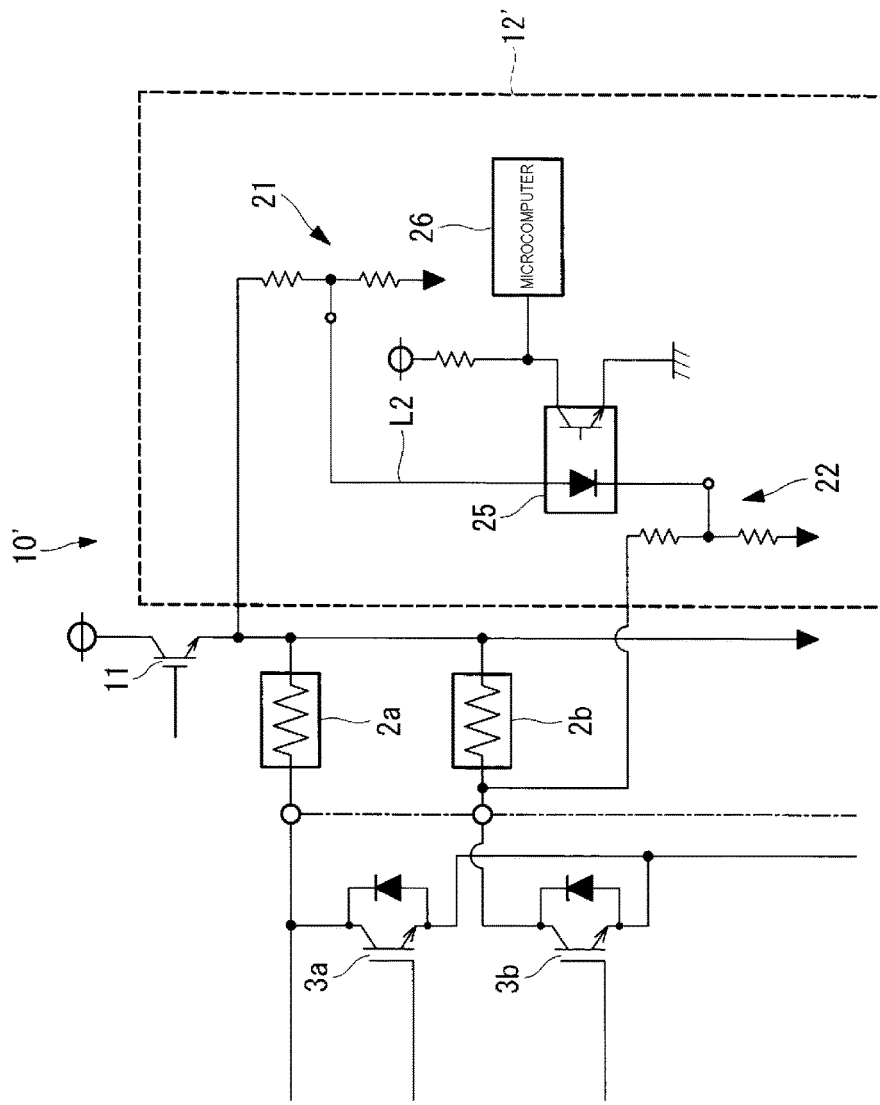
FIG. 3 is a diagram illustrating the overall configuration of an on-state malfunction detection device according to a second embodiment of the present invention.

Next, a PTC heater according to a second embodiment of the present invention will be described with reference to FIG. 3. FIG. 3 is a diagram illustrating the overall configuration of an on-state malfunction detection device 10' according to the present embodiment. As illustrated in FIG. 3, the on-state malfunction detection device 10' according to the present embodiment includes, as a detection unit 12', the high voltage-side voltage divider (first voltage divider) 21 connected to a high voltage side of the PTC element 2b, the low voltage-side voltage divider (second voltage divider) 22 connected to a low voltage side of the PTC element 2b, a photocoupler 25 connected in the forward direction in a line L2 connecting an output terminal of the high voltage-side voltage divider 21 and an output terminal of the low voltage-side voltage divider 22, and a microcomputer 26 into which a signal based on an output of the photocoupler 25 is inputted.

According to this configuration, a current flows in the photocoupler 25 in the case where the IGBT 3b is on and a current is flowing in the PTC element 2b, and an on signal is outputted to the microcomputer 26 as a result. On the other hand, no current flows in the PTC element 2b in the case where the IGBT 3b is off, and thus no current flows in the photocoupler 25 and an off signal is outputted to the microcomputer 26.

The microcomputer 26 determines that the IGBT 3b is on in the case where the on signal is inputted. For example, in the case where an off voltage is being applied to the gate of the IGBT 3b, the detection unit 12' determines an on-state malfunction in the IGBT 3b in the case where the on signal has been inputted to the microcomputer 26.

In the above-described first embodiment, the microcomputer 23 computes the electric potential difference following the voltage division, and thus two A/D converters (not illustrated) are necessary in the microcomputer 23; however, according to the present embodiment, an on-state malfunction can be detected with a simple element, namely the photocoupler 25, without using A/D converters.

[Third Embodiment

Figure 4:
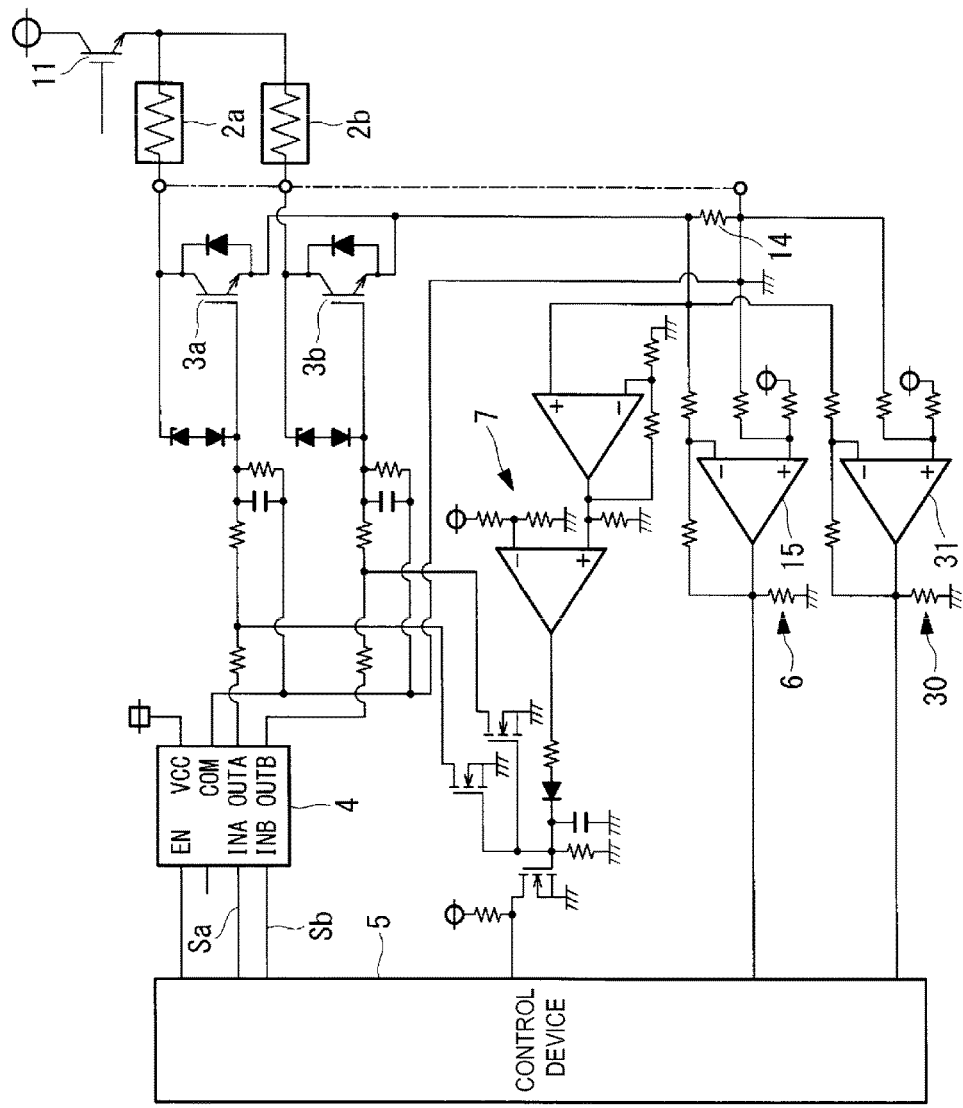
FIG. 4 is a diagram illustrating the overall configuration of an on-state malfunction detection device according to a third embodiment of the present invention.

Next, a PTC heater according to a third embodiment of the present invention will be described with reference to FIG. 4. FIG. 4 is a diagram illustrating the overall configuration of a PTC heater according to the present embodiment. The PTC heater according to the present embodiment differs from those of the above-described first and second embodiments in terms of the configuration of the on-state malfunction detection device.

Specifically, as illustrated in FIG. 4, an on-state malfunction detection device 30 according to the present embodiment includes, in place of the above-described detection units 12 and 12', an op-amp 31 that measures the voltage between both ends of the shunt resistor 14. Here, the op-amp 31 has a higher gain than that of the op-amp 15 provided in the current measurement unit 6.

By detecting the voltage between both ends of the shunt resistor 14 using the high-precision op-amp 31 in this manner, in cases where the electrical resistance value of the PTC element 2b is high, current values that conventionally have been obscured by error, an offset adjustment margin, and the like can be detected, which makes it possible to detect an on-state malfunction.

A voltage detected by the op-amp 31 is inputted to the control device 5. The control device 5 determines an on-state malfunction in the IGBTs 3a and 3b in the case where a voltage has been detected by the op-amp 31 regardless of a turn-off instruction being outputted to the IGBTs 3a and 3b.

Figure 5:
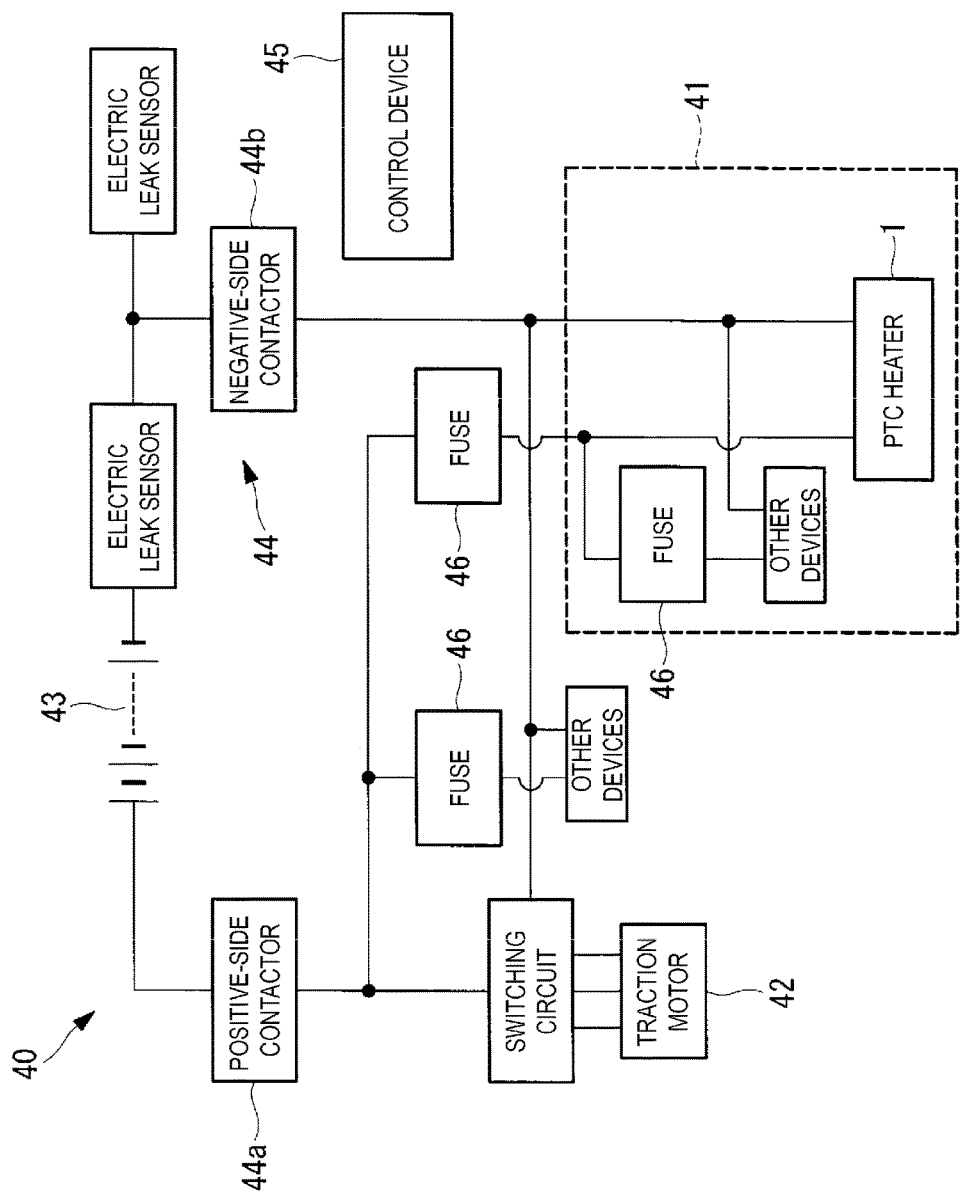
FIG. 5 is a diagram schematically illustrating the configuration of a high-voltage system of a vehicle according to an embodiment of the present invention.

Next, an embodiment of a vehicle including the above-described PTC heater will be described with reference to FIG. 5. FIG. 5 is a diagram schematically illustrating a high-voltage system in an electric automobile according to an embodiment of the present invention.

As illustrated in FIG. 5, an electric automobile 40 includes, for example, auxiliary equipment 41 including the PTC heater 1 according to the above-described first embodiment, an electrical storage device 43 used as a power source for the auxiliary equipment 41 and also used as a power source for a traction motor 42, a contactor (third switching element) 44 provided in a power line connecting the electrical storage device 43 and the auxiliary equipment 41, and a vehicle control device (called simply a "control device" hereinafter) 45. The contactor 44 has a positive-side contactor 44a and a negative-side contactor 44b.

A plurality of fuses 46 are provided in the high-voltage system of the electric automobile 40 as protection means for cases where overcurrent flows.

Next, an abnormality detection sequence carried out in the electric automobile 40 having the above-described configuration in the case where various sensors (not illustrated) provided within the vehicle have detected an abnormality will be described.

First, in the case where an abnormality (a current abnormality, a temperature abnormality, or a pressure abnormality, for example) has been detected by a sensor provided within the vehicle, the contactor 44 is opened for safety purposes. This may be carried out, for example, on the basis of an instruction from the control device 45, or, in the case where a protection device (not illustrated) is provided independently, may be carried out on the basis of an instruction from the protection device.

Next, with the contactor 44 remaining open, the control device 45 determines whether or not there is an overcurrent abnormality in the electrical storage device 43. As a result, the contactor 44 is kept open in the case where there is an overcurrent abnormality. On the other hand, in the case where there is no overcurrent abnormality, the contactor 44 is closed and it is determined whether or not there is an overcurrent abnormality in the auxiliary equipment 41.

As a result, in the case where it is determined that there is an overcurrent abnormality in the auxiliary equipment 41, the contactor 44 is opened again and kept in that state. On the other hand, in the case where it is determined that there is no overcurrent abnormality in the auxiliary equipment 41, a malfunction determination is carried out for each device in the auxiliary equipment 41.

Through this, for example, an on-state malfunction is detected by the on-state malfunction detection device 10 in the PTC heater 1 as described above, and the control device 45 is notified of the result. Malfunction diagnoses are carried out in the same manner for the other devices as well, and the control device 45 is notified of the results. Note that in the case where malfunctions are diagnosed, voltages supplied from the electrical storage device 43 to the respective devices may be reduced. For example, assuming a voltage of approximately 300 V is applied during normal operation, the voltage may be set to approximately ⅕ thereof, or 60 V, for example. Reducing the voltage in this manner makes it possible to reduce the chance of element malfunctions, electrocution, and the like.

Then, in the case where an on-state malfunction has been detected in the PTC heater 1, for example, an instruction to turn the IGBT 11 (see FIG. 1) off is outputted from the control device 45, and the IGBT 11 is kept off. The connection between the PTC heater 1 and the electrical storage device 43 is cut off as a result.

Opening the IGBT 11 in the PTC heater 1 in this manner makes it possible to cut off the electrical storage device 43 from only a device in which a malfunction has been detected (the PTC heater 1, for example), which in turn makes it possible to continue supplying power from the electrical storage device 43 to the other devices operating normally.

Although the control device 45 and the on-state malfunction detection device 10 of the PTC heater 1 are provided independent from each other in the present embodiment, the functions of the on-state malfunction detection device 10 may instead be provided in the control device 45. This makes it possible to simplify the configuration of the PTC heater 1.

Figure 6:
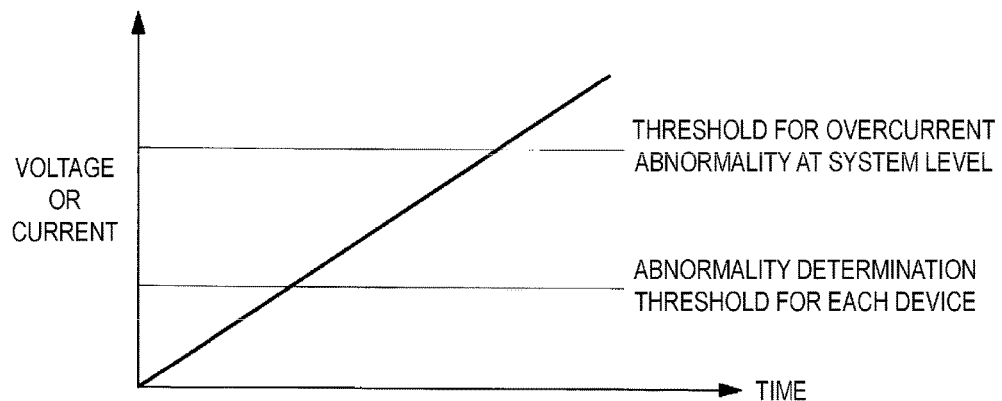
FIG. 6 is a diagram illustrating threshold values used in detecting a malfunction of a device.

In the above-described embodiment, in the case where it has been determined that there is an overcurrent abnormality in the auxiliary equipment 41, for example, the contactor 44 will be turned off and the supply of power to normally-functioning devices will be cut off in the case where an overcurrent abnormality is detected in any one of the devices. To avoid such a state, for example, as illustrated in FIG. 6, the threshold value for an on-state malfunction in each device (the PTC heater 1, for example) may be set to a value lower than the threshold value for an overcurrent abnormality at the system level in the control device 45.

By setting the threshold value for an on-state malfunction to a value lower than the threshold value for an overcurrent abnormality at the system level, detection of an on-state malfunction in the PTC heater 1 or the like can be finished before detecting an overcurrent abnormality in the auxiliary equipment 41. This makes it possible to continue supplying power to devices determined to be operating normally.

Although the present embodiment describes a case where the PTC heater 1 according to the first embodiment is provided in the electric automobile 40 as an example, the PTC heater according to the second or third embodiment may be provided instead.

It is preferable that the control device 45 be provided in the high-voltage system, and that power for the control device 45 be supplied from a low-voltage side (a 12 V system, for example). This makes it possible to measure current/voltage cheaply even in the case where the input voltage on the high-voltage system is low.

Although the present embodiment describes an electric automobile as an example, the invention is not limited to electric automobiles, and can also be applied in other vehicles, such as hybrid vehicles, internal combustion engine vehicles that do not have high-voltage batteries, and the like.

The present invention is not limited to the above-described embodiments, and various modifications, such as combining some or all of the above-described embodiments, can be implemented without departing from the essential spirit of the invention.

REFERENCE SIGNS LIST

1 PTC heater
2a, 2b PTC element
3a, 3b, 11 IGBT
4 Drive circuit
5 Control device
10, 10', 30 On-state malfunction detection device
12, 12' Detection unit
14 Shunt resistor
21 High voltage-side voltage divider
22 Low voltage-side voltage divider
23, 26 Microcomputer
25 Photocoupler
31 Op-amp
40 Electric automobile
41 Auxiliary equipment
43 Electrical storage device
44 Contactor
45 Control device

The invention claimed is:

1. A vehicle comprising: auxiliary equipment including a PTC heater provided with an on-state malfunction detection device configured to detect an on-state malfunction in a first switching element that is provided corresponding to an element whose electrical resistance value varies according to temperature and that controls electrification of the element;
   an electrical storage device used as a power source for the auxiliary equipment;
   a contactor provided in a power line connecting the electrical storage device and the auxiliary equipment; and
   a vehicle control device,
   wherein the on-state malfunction detection device includes a detection unit that, in a state in which a turn-off instruction that is a control signal for bringing the first switching element to a non-conduction state has been outputted and power is capable of being supplied to the element, detects an on-state malfunction in the first switching element in the case where a parameter regarding a voltage between both ends of the element is greater than or equal to a predetermined threshold value, and
   wherein the vehicle control device:
   determines, in the case where an abnormality is detected in the vehicle and the contactor has been opened, whether or not the abnormality is an overcurrent abnormality in the electrical storage device, with the contactor open;
   determines, in the case where the abnormality is determined not to be an overcurrent abnormality, whether or not the abnormality is an overcurrent abnormality in the auxiliary equipment, with the contactor being closed; and
   detects a malfunction in the various devices that constitute the auxiliary equipment in the case where it has been determined that the abnormality is not an overcurrent abnormality in the auxiliary equipment.

2. The vehicle according to claim 1, further comprising:
   a second switching element provided in a power source line that supplies power to the element,
   wherein the second switching element is turned off in the case where an on-state malfunction has been detected by the detection unit.

3. The vehicle according to claim 2, wherein in the case where an on-state malfunction in the first switching element has not been detected, the detection unit causes a turn-off instruction to be outputted to the second switching element and causes a turn-on instruction that is a control signal for bringing the first switching element to a conduction state to be outputted, and in this state, detects an on-state malfunction in the second switching element in the case where a parameter regarding a voltage between both ends of the element is greater than or equal to a predetermined threshold value.

4. The vehicle according to claim 1,
wherein the detection unit includes:
a first voltage dividing unit connected to a high-voltage side of the element;
a second voltage dividing unit connected to a low-voltage side of the element; and
a photocoupler connected in a forward direction in a line connecting an output terminal of the first voltage dividing unit and an output terminal of the second voltage dividing unit, and an on-state malfunction is detected on the basis of an output of the photocoupler.

5. The vehicle according to claim 1, wherein when detecting a malfunction in the auxiliary equipment, a voltage lower than a voltage supplied during normal operation is supplied from the electrical storage device.

6. The vehicle according to claim 1, wherein a malfunction determination threshold value for the devices used when detecting a malfunction in the auxiliary equipment is set to a value lower than a determination threshold value used by the vehicle control device to determine an overcurrent abnormality in the auxiliary equipment.

7. The vehicle according to claim 1, wherein the on-state malfunction detection device is provided in the vehicle control device.

8. A malfunction detection method for a vehicle comprising: auxiliary equipment including a PTC heater provided with an on-state malfunction detection on-state malfunction in a first switching element that is provided corresponding to an element whose electrical resistance value varies according to temperature and that controls electrification of the element: an electrical storage device used as a power source for the auxiliary equipment; a contactor provided in a power line connecting the electrical storage device and the auxiliary equipment; and a vehicle control device, the method comprising:

detecting, in a state in which a turn-off instruction that is a control signal for bringing the first switching element to a non-conduction state has been outputted and power is capable of being supplied to the element, an on-state malfunction in the first switching element in the case where a parameter regarding a voltage between both ends of the element is greater than or equal to a predetermined threshold value; and determining, in the case where an abnormality is detected in the vehicle and the contactor has been opened, whether or not the abnormality is an overcurrent abnormality in the electrical storage device, with the contactor open, and determining, in the ease where the abnormality is determined not to be an overcurrent abnormality, whether or not the abnormality is an overcurrent abnormality in the auxiliary equipment, with the contactor being closed, and detecting a malfunction in the various devices that constitute the auxiliary equipment in the case where it has been determined that the abnormality is not an overcurrent abnormality in the auxiliary equipment.

* * * * *